United States Patent
Khuri-Yakub et al.

(10) Patent No.: US 7,615,834 B2
(45) Date of Patent: Nov. 10, 2009

(54) CAPACITIVE MICROMACHINED ULTRASONIC TRANSDUCER(CMUT) WITH VARYING THICKNESS MEMBRANE

(75) Inventors: Burtis Khuri-Yakub, Palo Alto, CA (US); Arif Sanli Ergun, Mountain View, CA (US); G. Göksenin Yaralioglu, Mountain View, CA (US); Yongli Huang, San Jose, CA (US); Sean Hansen, Sunnyvale, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 154 days.

(21) Appl. No.: 11/707,623

(22) Filed: Feb. 16, 2007

(65) Prior Publication Data
US 2007/0215964 A1    Sep. 20, 2007

Related U.S. Application Data

(60) Provisional application No. 60/777,867, filed on Feb. 28, 2006.

(51) Int. Cl.
*H01L 41/113* (2006.01)
*H01L 29/84* (2006.01)
(52) U.S. Cl. .................. 257/416; 257/417; 257/418; 257/419; 257/E29.324; 438/52; 438/53
(58) Field of Classification Search ............... 257/417, 257/418, 419, E29.324; 438/52, 53
See application file for complete search history.

(56) References Cited

U.S. PATENT DOCUMENTS

| | | | | |
|---|---|---|---|---|
| 4,382,247 A | * | 5/1983 | Stecher et al. | 338/42 |
| 6,140,143 A | * | 10/2000 | Christel et al. | 438/53 |
| 7,074,634 B2 | * | 7/2006 | Foglietti et al. | 438/50 |
| 2004/0180466 A1 | * | 9/2004 | Foglietti et al. | 438/53 |
| 2005/0018536 A1 | * | 1/2005 | Caliano et al. | 367/7 |

* cited by examiner

*Primary Examiner*—Ngan Ngo
*Assistant Examiner*—Benjamin Tzu-Hung Liu
(74) *Attorney, Agent, or Firm*—Perkins Coie LLP (57) ABSTRACT

Structure for capacitive micromachined ultrasonic transducer (CMUT) device or other vibrating membrane device having non-uniform membrane so that membrane mass and stiffness characteristics may be substantially independently adjusted. CMUT having trenched membrane and/or membrane with non-uniform thickness or density. Method for operating transducer or vibrating membrane device. Array of devices at least some of which have non-uniform membrane properties. CMUT comprising substrate, support for membrane, and membrane extending over support to create cavity, membrane having non-uniform membrane thickness resulting from at least one of: thickening on upper surface of the membrane outside of cavity, thickening on lower surface of membrane inside cavity, trench on upper surface of membrane, trench on lower surface of the membrane, and any combination of two or more of these. Method for fabricating CMUT or vibrating membrane device having non-uniform membrane. High mechanical sensitivity transducer for sensor, microphone, and/or transmitter.

60 Claims, 7 Drawing Sheets

CAPACITIVE MICROMACHINED ULTRASONIC TRANSDUCER(CMUT) WITH VARYING THICKNESS MEMBRANE

CROSS-REFERENCE TO RELATED PATENT APPLICATIONS

This patent application claims the benefit under 35 U.S.C. 119(e) to U.S. Utility Patent Application Ser. No. 60/777,867 filed on 28 Feb. 2006; which application is hereby incorporated by reference.

GOVERNMENT SUPPORT

This invention is supported in part by the U.S. Army Research Office under Contract No. DAAD19-00-1-0190. The Government has certain rights in this invention.

FIELD OF THE INVENTION

This invention pertains generally to the structure of capacitive micromachined ultrasonic transducer devices and methods for operating such transducer devices, and more particularly to structures and methods of operation of capacitive micromachined ultrasonic transducer devices having variable thickness membranes.

BACKGROUND

Conventional capacitive micromachined ultrasonic transducer (CMUT) device structure provide that the thickness of the membrane is made uniform over the gap or cavity formed between the transducer membrane and the transducer substrate. The thickness and the lateral dimensions of the membrane (or diameter or radius for a circular membrane) as well as the membrane material properties determine the stiffness and the mass of the membrane and therefore determine important device parameters such as capacitance, collapse voltage, and operation frequency. Both the stiffness and the mass of the membrane typically increase as the lateral dimensions and thickness increase. With a uniform membrane thickness, it has heretofore not been possible to control these mass and stiffness parameters separately or independently or even substantially separately or independently or to achieve an optimum transducer performance.

Therefore there remains a need for an ultrasonic transducer device, such as a capacitive micromachined ultrasonic transducer (CMUT) device for which transducer membrane mass and stiffness parameters may be substantially separately or independently controlled so that device parameters such as capacitance, collapse voltage, and operational frequency may be defined to achieve an optimum transducer performance.

BRIEF DESCRIPTION OF THE DRAWINGS

FIG. 1 is an illustration showing transducers having membranes with non-uniform thickness, including in FIG. 1(a) an embodiment in which a thicker central part of the membrane is on the outer surface of the membrane outside of the transducer cavity, in FIG. 1(b) an embodiment in which the thicker central part of the membrane is on the inner membrane surface inside of the transducer cavity, and in FIG. 1(c) an embodiment similar to that in FIG. 1(a) with additional patterning on the upper surface of the thickened portion of the membrane.

SUMMARY

In one aspect, the invention provides a capacitive micromachined ultrasonic transducer (CMUT) or other vibrating membrane device that has a non-uniform membrane structure.

In another aspect, the invention provides a capacitive micro-machined ultrasonic transducer (CMUT) or other vibrating membrane device that may be used as a microphone or sensor alone or in an array that has a higher mechanical sensitivity.

In another aspect, the invention provides a capacitive micro-machined ultrasonic transducer that includes: a substrate; a support having a base in contact with the substrate, and a wall extending away from the base to a top; and a membrane having an upper surface and a lower surface and extending in a lateral dimension parallel to the support and between the support wall to create a cavity defined by the substrate, the wall, and the membrane lower surface and a defining a gap between the substrate and the membrane; the membrane having a non-uniform membrane thickness extending in a direction orthogonal to the membrane surface, the non-uniformity in the membrane thickness resulting from at least one of: (i) a thickening on the upper surface of the membrane outside of the cavity, (ii) a thickening on the lower surface of the membrane inside of the cavity, (iii) a trench on an upper surface of the membrane, (iv) a trench on a lower surface of the membrane, and (v) any combination of two or more of these.

In yet another aspect, the invention provides an array of capacitive micro-machined ultrasonic transducers, at least some of which and potentially all of which, include non-uniform membrane structures.

In still another aspect, the invention provides the invention increases the mass of a membrane in the center which advantageously increases the electrical capacitance of the device.

In still another aspect, the invention provides a method of fabricating a capacitive micro-machined ultrasonic transducer.

Other aspects and features of the invention will become apparent in light of the detailed description provided herein.

DESCRIPTION OF EXEMPLARY EMBODIMENTS OF THE INVENTION

Embodiments of the invention provide a novel structure for a capacitive micro-machined ultrasonic transducer element and array, method for operating such transducer devices and arrays, and to methods for making or fabricating such CMUT devices and arrays. In particular embodiments of the invention provide for structures having a non-uniform membrane structures, including membranes having one or more of thickened regions, trenched regions, and combination of these. The inventive transducers may be used as output devices to generate an output pressure of force as well as input devices for sending an external condition in the environment and generating an electrical signal based on a capacitive, charge, current, or voltage signal change.

Embodiments of the invention provide a novel capacitive micromachined ultrasonic transducer (CMUT) device structure as well as method for making or fabricating, operating, and improving the performance of such capacitive micromachined ultrasonic transducers (CMUTs). Historically, CMUTs were developed as an alternative to piezoelectric transducers for transmission and reception of ultrasound (See for example, O. Oralkan, A. S. Ergun, J. A. Johnson, M. Karaman, U. Demirci, K. Kaviani, T. H. Lee, and B. T. Khuri-Yakub, "Capacitive Micromachined Ultrasonic Transducers: Next-Generation Arrays for Acoustic Imaging?," IEEE Trans. Ultrason., Ferroelect., Freq. Contr., vol. 49, pp. 1596-1610, November 2002, which is hereby incorporated by reference.)

Certain techniques for the fabrication of capacitive micromachined ultrasonic transducers have been described in many publications and patents and are known in the MEMS fabrication literature. For example U.S. Pat. No. 6,958,255B2, U.S. Pat. No. 5,619,476, U.S. Pat. No. 5,870,351 and U.S. Pat. No. 5,894,452, each incorporated herein by reference, describe certain techniques for the fabrication of capacitive or electrostatic type ultrasonic transducers.

A typical CMUT device may be comprised of many membranes disposed between supports structures such as walls or posts over vacuum cavities or gaps. The thickness of the membrane is conventionally made uniform over the cavities or gap. In the instant invention, membranes are fabricated with varying thickness, wherein the varying thickness may include thickened portions, thinned portions, and/or various combinations of these. This allows fine tuning of stiffness and mass of the membrane separately. Moreover, it has been discovered that if the central part or regions of the membrane is made thicker that other parts or portions of the membrane, it is possible to generate more output pressure from the CMUT transducer.

A plurality of CMUTs may be disposed or organized as a single or multi-dimensional array. As the array includes a plurality of individual transducers, the individual transducers may be made or fabricated to have the same structure or different structures according to the various embodiments described herein. Variable thickness transducer structures may optionally be combined with constant thickness membrane transducers should a desired array operating or performance need suggest such combination. That is, different membranes within a capacitive micromachined ultrasonic transducer array having a plurality of individual transducers may be fabricated with differing membrane thicknesses and/or with different structures having the same thickness but wherein the thicknesses are built-up or provided in a different manner according for example to the different embodiments described herein.

It will therefore be appreciated that among the structural and methodological improvements over conventional structures, devices, and methods of making and operating a capacitive micromachined ultrasonic transducer (CMUT) or transducer array are the changing of the thickness of the membrane in the membrane (lateral) plane and particular ways to design and fabricate a membrane or an array of membranes having a desired variable thickness membrane profile and associated operational characteristics.

Typical conventional CMUT membranes are made in uniform thickness. The thickness and the lateral dimensions of the membrane (for example, the diameter or radius of a circular membrane) as well as the material properties determine the stiffness and the mass of the membrane and therefore determine important device parameters such as capacitance, collapses voltage, and operation frequency. Both the stiffness and the mass of the membrane typically increase as the lateral dimensions and thickness increase. With a uniform membrane thickness, it has not heretofore been possible to control these parameters separately or independently. However, using a non-uniform membrane thickness or profile, it becomes possible to adjust these parameters, to some extent, individually, separately, and independently. Because adding mass or thickness to a transducer membrane may also result in some small change in stiffness, the relationship between all of the parameters may not be completely individual, separate, and independent, it is substantially so. Adding trenches or mass in the center does provide control over spring constant and mass separately but they may not be completely independent controls as when a mass is added may be some change in stiffness where the mass is located and this results in change in overall stiffness, however the influence on mass is much stronger. As compared to conventional structures and methods, the control is substantially separate and independent and one may at least partially compensate for these influences in the design. In embodiments which include trenches and non-uniform membrane thickness the ability to achieve some independence in parameters may be further enhanced. This enables setting various transducer parameters (and indeed CMUT array parameters) independent of each other, such as for example the collapse voltage and operation frequency among other transducer or transducer array parameters.

It may be appreciated that although circular membranes are described by way of example, CMUT cells and membranes need not be circular or any other particular shape, and by way of example but not limitation, cells may be square, rectangular, pentagonal, hexagonal, or any other polygon, or regular or irregular shape. Furthermore, in embodiments of the CMUT cells that include one or more trenches, such trenches may be any shape, and although in many embodiments, the trenches may follow that shape or not follow the shape and be different from it. When a plurality of trenches are made, formed, or otherwise provided, their shape or path within a cell may be different. For example, if the cell has a hexagonal shape and has three trenches, one trench may follow the hexagonal membrane shape near the peripheral edge of the membrane, a circular or annular trench nearer to the mid-radius region of the cell, and a dodecagonal shaped trench intermediate between the other two trenches. The width and depth of the different trenches may also vary.

Although the description provided here primarily focuses on capacitive ultrasonic micro-machined transducers (CMUTs) it should be appreciated that the discoveries and principles apply to a broad range of vibrating membrane devices, and the invention should be interpreted to include not only CMUTs but other vibrating membrane devices and arrays as well.

Figures 1, 1A, 1B, 1C:
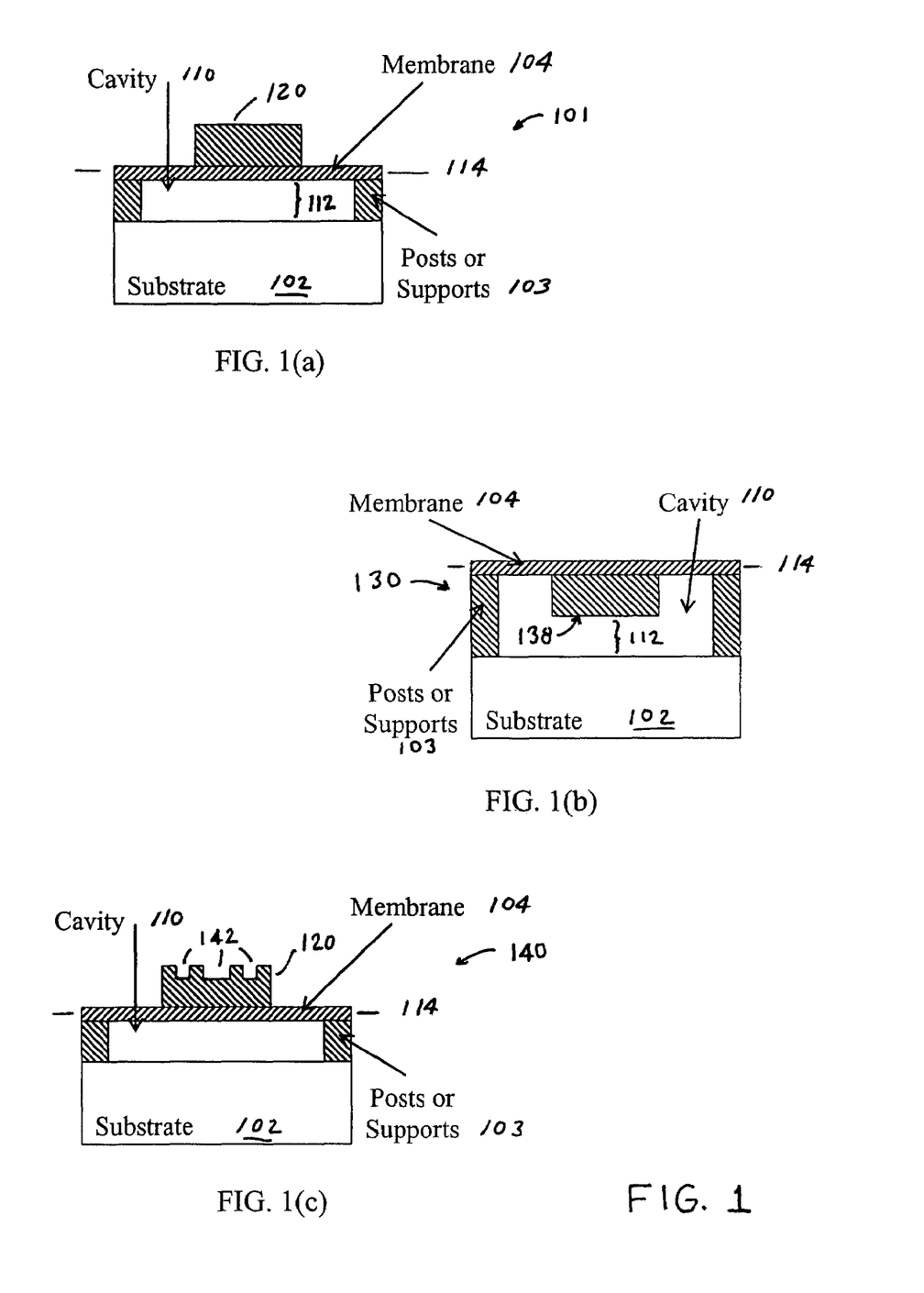
Figure 2:
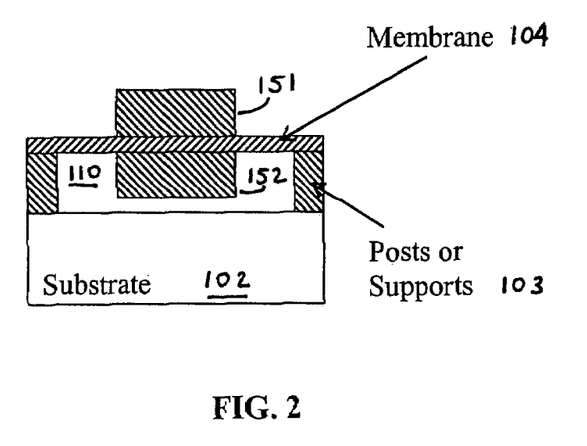
FIG. 2 is an illustration showing a transducer having a membrane with non-uniform thickness having a thicker central part of the membrane that is in part disposed about a plane of the membrane on both outer and inner surfaces of the membrane.

FIG. 1 and FIG. 2 shows three exemplary implementations of transducer devices having non-uniform membrane thickness, in these non-limiting embodiments, transducer membranes having a thicker central membrane portion as compared to portions of the membrane outside the central portion.

In a non-limiting embodiment of FIG. 1(a), the CMUT cell 101 includes a substrate 102, posts or other support 103 to separate and support the membrane 104 from the substrate 102 such as for example a walled structure. The space between a lower or interior surface 106 of the membrane 104 and an upper or interior surface 108 of the substrate 102 defines a cavity 110, and the space between the membrane and the substrate defines a transducer gap 112. In the embodiment of FIG. 1(a), a thickened portion 120 of the CMUT cell is attached to, deposited on, formed integral with, or otherwise fabricated to lie above the nominal plane 114 of the membrane 104. It will be appreciated that the thickened portions increases the local mass and alters the mass distribution of the CMUT cell. Alternatively, the membrane may be formed to a greater thickness and a portion or portions of the membrane may then be removed to create the desired membrane thickness profile or configuration. The provision of a thickened potion also adds to the mass of the transducer cell, typically toward the center of the cell, and by adding mass to the membrane, the electrical capacitance of the device is advantageously increased. This is true for transducer cells with or without trenches as described herein, and of course transducer arrays benefit from the increased capacitance of their constituent cells.

FIG. 1(b) is an illustration showing an alternative embodiment of the inventive CMUT cell 130 wherein the thickened portion 138 of the CMUT cell is attached to, deposited on, formed integral with, or otherwise fabricated to lie below the nominal plane 114 of the membrane 104. For a post or support structure having the same height above the substrate, the gap distance may be somewhat decreased and it will be appreciated that the posts or other supports 103 may be increased if the same gap distance is to be maintained. As with the embodiment of FIG. 1(a), the membrane may be formed to a greater thickness and a portion or portions of the membrane may then be removed to create the desired membrane thickness profile or configuration.

FIG. 1(c) is an illustration showing another alternative embodiment of the inventive CMUT cell 140 wherein the thickened portion 138 of the CMUT cell is attached to, deposited on, formed integral with, or otherwise fabricated to lie above the nominal plane 114 of the membrane 104 as in the embodiment of FIG. 1(a) and includes additional patterning on an outer surface in the form of depressions or dimples 142. Although FIG. 1(c) illustrates these in cross-section, it may be appreciated that this patterning may be implemented over the two dimensional surface of the membrane. Such patterning may be useful to fine tune the mass distribution, membrane stiffness, and/or other properties. In addition to other techniques known in the arts, it may be appreciated that a process like electro-plating or electro-deposition may also be used to form masses of metals such as gold or copper on the top surface of the membrane. Deep reactive ion etching may be used as a technique for forming grooves in a membrane to define thinner regions or portions of the membrane in addition to or as an alternative to other methods and techniques known in the art.

Embodiments of the CMUTs describe herein may utilize materials for the different CMUT structures as are known in the art. For example, the membrane material can be made of silicon or silicon nitride or aluminum oxide (sapphire) or diamond or any other material that can be made into a thin layer and bonded to a substrate with a cavity. The added masses above or below the membrane can be any of the materials mentioned above, or electroplated metals such as gold or copper or any other metal that is amenable to growth under photolithography control.

In non-limiting embodiments of the invention, the substrate may be formed of a material chosen from among various silicon or silicon-based materials, silicon nitride, aluminum oxide, glass, quartz, or other materials. In non-limiting embodiments of the invention, the support may by way of example, but not limitation be formed of an oxide material, silicon nitride, diamond, or other materials. In non-limiting embodiments of the invention, the membrane may be formed of silicon or a silicon-based material, silicon nitride, diamond, aluminum oxide, glass, or other materials. It may be appreciated that numerous materials are known in the art of MEMS and capacitive micro-machined ultrasonic transducer technology and such materials as are known, in the art may be utilized for the embodiments of the CMUTs described herein.

FIG. 2 is an illustration showing a non-limiting embodiment of the inventive CMUT cell having first and second thickened portions 151, 152 which are disposed on either side of the center lateral plane 114 of the membrane 104. Each of the thickened portions may have a different lateral dimension and a different thickness, even though the embodiment in FIG. 2 shows thickened portions that are substantially the same lateral dimension and thickness. Different materials may optionally be used for different thickened portions to provide a different mass of the thickened portion even for the same physical dimension or size.

Each transducer membrane configuration may be implemented using various fabrication techniques, including for example various micromachining techniques. The last one for example can be built first by fabricating membranes where the thick part is in the cavity. The top part can be made of metal deposited and patterned over the first part. While the thicker central portion is illustrated in these embodiments as having a substantially rectangular lateral cross section having a uniform thickness and where in the uniform thickness is thicker than the underlying (or overlying) membrane, it will be appreciated that the thickness of the thicker portion may be greater than the underlying (or overlying) membrane or thinner than the underlying (or overlying) membrane. It may also be appreciated that the thicker portion need not have a rectangular lateral cross section having a uniform thickness, but instead that the lateral cross section may vary from region to region. The variation from region to region may by way of example but not limitation have such stepped rectangular cross section, a smooth or ramped transition between different thicknesses, a multi-step staircase type structure, and/or any other profile. For example, the thickness may vary from a first outer edge of the membrane to the center and to the opposite second outer edge in a smooth curve, in a plurality of steps, or in any other manner. Non-symmetric thickness profiles may also or alternatively be provided.

Another advantage of non-uniform membrane thickness is that one can maximize or otherwise control or achieve a desired average membrane displacement or other membrane displacement or movement property. For a uniform thickness membrane, the central portion of the membrane moves with greater vibration amplitude compared to the vibration amplitude close to the edge of the membrane adjacent its support, and the displacement profile reduces significantly towards the membrane edge. These conventional operational characteristics may be modified using the non-uniform membrane.

Figure 3:
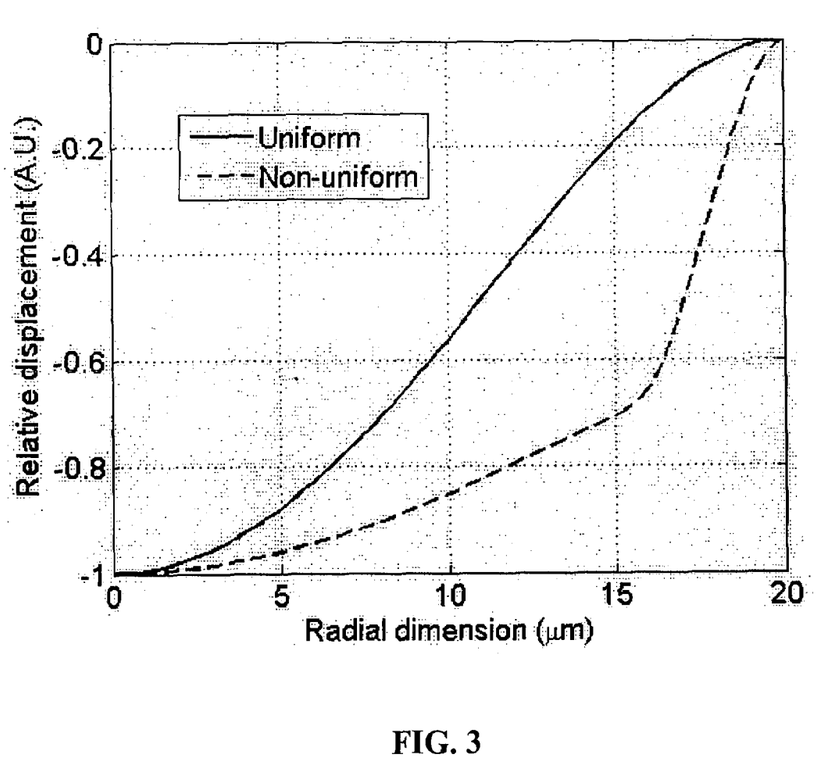
FIG. 3 is an illustration showing harmonic vibration amplitude of exemplary uniform and non-uniform membranes as a graphical plot of relative displacement versus radial dimension.

FIG. 3 is a graph showing exemplary harmonic vibration amplitude plots for an exemplary circular uniform thickness membrane and one for an exemplary circular non-uniform thickness membrane. The exemplary uniform thickness membrane is 1 micron thick and 20 micron in radius. The exemplary non-uniform membrane has the same 20 micron radius (40 micron diameter) as the uniform thickness membrane but it has a 3 micron thick portion in a region at and surrounding the membrane center. The radius of the thicker portion at the center is 16 microns. It may be noted from the graph that the total average membrane displacement of the uniform membrane is 26% of the center displacement. However, for the non-uniform membrane same ratio (total average membrane displacement to the center membrane displacement) is increased to 53%, or somewhat more than doubled as compared to the uniform membrane.

As discussed above, by modifying the membrane thickness profile or membrane shape, one can increase the average displacement and/or modify other membrane displacement characteristics. The effect of this increase in average displacement for a transducer will be increased output pressure. It may be appreciated that this example has been for a single CMUT transducer cell and that the properties on a CMUT array having a plurality of individual transducer cells may be an aggregate of the performance of the individual transducers.

Figure 4:
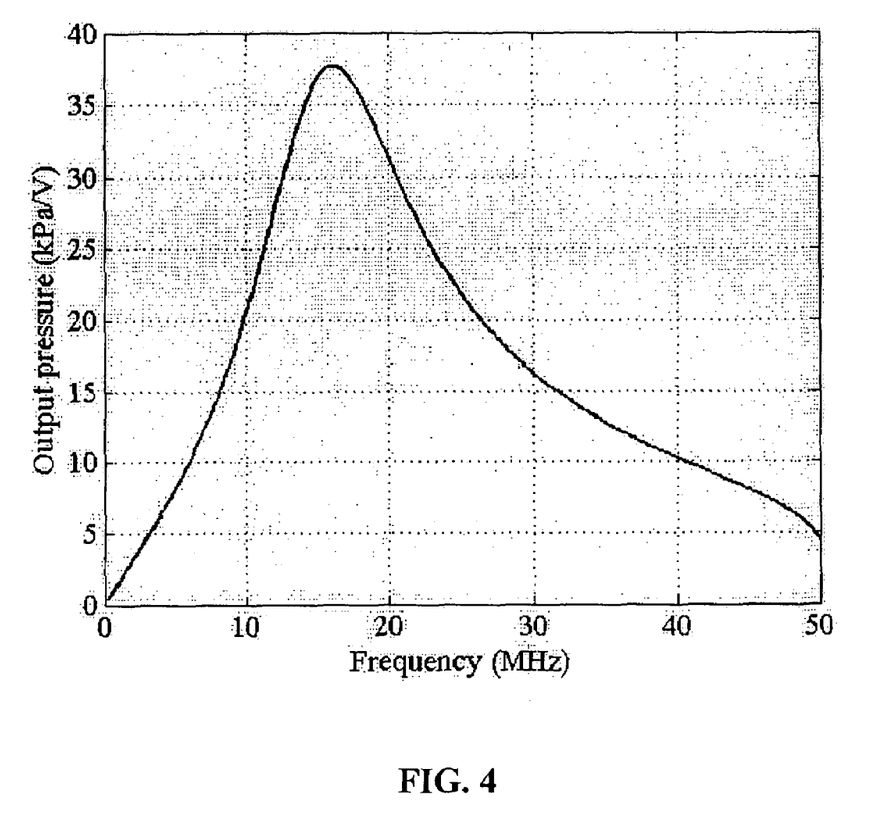
FIG. 4 is an illustration showing transducer output pressure as a function of frequency of an exemplary non-uniform membrane.

FIG. 4 is an illustration showing output pressure characteristics of an exemplary transducer having a non-uniform membrane thickness over its surface(s) and in particular shows the output pressure (in kPa/V) as a function of frequency (MHz) of an exemplary transducer having a non-uniform membrane with a thicker central portion. The thickness of the central part or portion of the membrane is 3.2 microns and the membrane is otherwise 1.3 microns thick in unthickened regions. The radius of the central thickened region or mass is 8 microns. The gap distance in this particular embodiment is 0.134 microns. This membrane has the resonant frequency of 21.71 MHz in air. For a uniform membrane that has the same resonant frequency and air gap, the output pressure is only one-half of the peak pressure (about 37.5 kPa/V) shown in FIG. 4. These design and performance values are merely illustrative of the comparative performance between similar transducers one having a uniform membrane structure thickness and the other having some variant of a non-uniform membrane structure thickness, and are not limitations of the invention itself as those skilled in the art will appreciate in light of the description provided here that the shapes, sizes, configurations, gap distances, and other design and operational features of non-uniform thickness CMUT transducers may readily be selected to achieve desired design and performance criteria.

Figure 5:
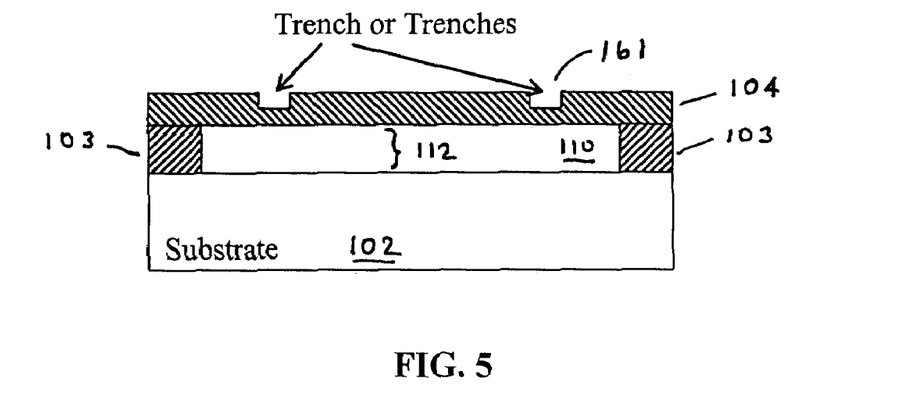
FIG. 5 is an illustration showing an embodiment of a CMUT structure having at least one trench having a thinner membrane region formed into an otherwise constant thickness or variable thickness membrane according to an embodiment of the invention.

FIG. 5 is an illustration showing a non-limiting embodiment of a CMUT structure having a substrate 102, posts or other support 103, a defined cavity 110 and gap 112, as well as at least one trench, channel, notch, depression 161 or the like. The trench or channel 161 is thinner membrane region formed into an otherwise constant thickness or variable thickness membrane. In the illustrated embodiment, the trench 161 may be a single annular shaped region which in the cross-sectional view of the embodiment of FIG. 5 appears as two rectangular shaped notches symmetrical of the center of the transducer and concentric with the peripheral edge of the membrane. In addition to membranes with thicker central part, other configurations are also possible. This trench reduces the stiffness of the membrane while keeping the total membrane mass more or less constant, the mass being reduced only by the small amount of material within the trench. The thickness of the membrane may be increased either uniformly or non-uniformly if there is a desirability to maintain the mass precisely the same as for an untrenched membrane. Although the trench shown here is illustrated as a rectangular notch having a depth of about ½ the total surrounding membrane thickness, and a width of about 2 times the depth, it will be apparent to those workers having skill in the art in light or the description provided herein that the depth, width, trench shape profiles, as well as the number of trenches and their locations may be independently varied to achieve a desired operational and/or performance characteristic.

In one non-limiting embodiment, a capacitive micro-machined ultrasonic transducer is provided in which the provision at least one trench reduces the stiffness of the membrane while keeping the total membrane mass about the same as a membrane without a trench. By way of example but not limitation, embodiments of CMUT membrane structures are provided where the total mass of the trenched membrane is within substantially 10% of the mass of the untrenched membrane. In other embodiments, the total mass of the trenched membrane is within substantially 10% of the mass of the untrenched membrane. In yet other embodiments, the total mass of the trenched membrane is within substantially 5% of the mass of the untrenched membrane. In still other embodiments, the total mass of the trenched membrane is within substantially 2% of the mass of the untrenched membrane, while in other embodiments, it is within substantially 1% or less of the mass of the untrenched membrane.

The trenched portions of the membrane may be considered as thinner portions of the membrane while the untrenched portions represent thicker portions. The trenches may be formed on the upper surfaces of the membrane outside of the cavity, on the lower surfaces within the cavity, or both on upper and lower surfaces. In some embodiments providing for trenches on both upper and lower portions of the membrane, the trenches may be formed at the same or substantially the same locations to that they overlie (or underlie) each other or may be formed at different locations, such as for example at different radii from the center of a circular membrane and have the form of concentric annular trenches. Membranes are not limited to circular shaped membranes. Where multiple trenches are formed or provided their width, depth, shape, or other characteristic may be independently varied. Analogously, where a plurality of transducers are formed as a CMUT array, different array CMUT cells or elements may have different membrane characteristics including trenched and untrenched transducer membranes.

In one non-limiting embodiment, the invention provides a capacitive micro-machined ultrasonic transducer wherein the membrane is a substantially circular membrane, and comprises at least one annular or circular trench that is substantially concentric with the outer peripheral edge of the membrane, and optionally plurality of substantially concentric annular or circular such trenches, disposed between the center and the outer circular edge of the membrane. In another non-limiting embodiment, the substantially concentric annular or circular trench or trenches is/are disposed at a distance of between about 10% and 50% of the radius of the membrane. In another non-limiting embodiment, the substantially concentric annular or circular trench or trenches is/are disposed toward the outer non-central portion of the membrane at a distance of between about 50% and 100% of the radius of the membrane. In another non-limiting embodiment, the substantially concentric annular or circular trench or trenches is/are disposed near the outer edge of the membrane at a distance of between about 75% and 100% of the radius of the membrane. In another non-limiting embodiment, the substantially concentric annular or circular trench or trenches is/are disposed near the outer edge of the membrane at a distance of between about 70% and 90% of the radius of the membrane. It may be understood that one or a plurality of trenches may be placed at any location on either side of the membrane to achieve a desired operation or performance and that the trench or trenches may have various shapes and are not limited to circular or annular shapes or even to symmetric shapes, nor are they limited to rectangular notches having three sides and an open side, but may variously be rectangular, cup-shaped, v-notch shaped, other defined shape or merely represent a smooth depression where the membrane material is thinned as compared to other portions of the membrane. Different shapes and/or trench configurations may have different advantages and disadvantages so that the structural configuration may advantageously be chosen to achieve desired operation and performance criteria.

It may also be appreciated that trenched membranes may be combined with the additional thickened portions such as have been described relative to the embodiments illustrated FIG. 1 and FIG. 2, such for example as illustrated in and described relative to embodiment described relative to FIG. 6 herein below.

The inventive structure and method involves modifying the membrane thickness to modify and control the characteristics of the transducer and when characteristics and parameters are appropriately chosen to change or improve the performance or some operating characteristic of the transducer and/or of an array of transducers. By using this structure, and method, one can independently select spring constant (or stiffness) and mass of the membrane. By doing this, one can among other controls, modify the operation to improve the average displacement and hence output pressure as well as the sensitivity of the transducer.

Figure 6:
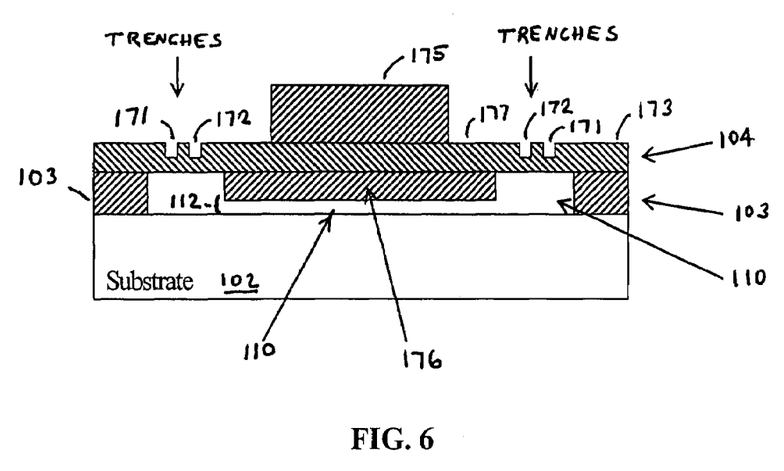
FIG. 6 is an illustration showing an embodiment of a CMUT structure having a plurality of trenches and differently size thickened membrane regions on the outer and inner surfaces of a central lateral plane of the membrane.

Alternative and in some sense more complicated or complex membrane thickness variations are possible, as shown by way of example for example in the embodiment of FIG. 6. For example the embodiment of FIG. 6 provides an embodiment of the CMUT 170 having a plurality of concentric trenches, including for a circular membrane 104, first and second annular shaped trenches 171, 172 located nearer to the peripheral edge 173 of the membrane than to the center of the membrane. The central portion of the membrane includes a first thickened portion 175 attached to or formed integral with the upper (outer) surface of the rest of the membrane 104, and a second thickened portion 176 attached to or formed integral with the lower (inner) surface of the rest of the membrane 104 and within the transducer cavity or gap. The cavity or gap is usually evacuated or in a vacuum condition as is known in the art. As was described relative to the embodiment of FIG. 5, the provision of one or more trenches reduces the stiffness of the membrane while keeping the total membrane mass more or less constant. Furthermore, this embodiment provides for a first thicker central portion 175 on the membrane 104 having a first radius (r1) diameter (d1) and a second thicker central portion xxx having a second radius (r2) or diameter (d2) within the cavity. The first and second radius of diameters may be separately adjusted so that the first radius or diameter is the same or substantially the same diameter as the second radius or diameter, or the first diameter may be greater than the second diameter, or the first diameter may be less than the second diameter. With respect to the different trench locations and sizes (widths in particular), the trenches may be located and sized so that overlap is avoided. Alternatively trenches may overlap so as to form a step shaped trench so that the trench as a depth profile that is non-constant and varies over the with of the single or combined trench.

It may be appreciated that although the illustrations show different membrane 104 and thickened portions deposited on, attached to, or formed integral with the membrane, in at least some non-limiting embodiments, the existence of separate layers may not be apparent and the description of the different structures is for the purpose of ready description. Embodiments of the invention are therefore intended to include CMUT cells and array of cells having the described membrane thickness and or mass distribution profiles independent of the existence of separate layers or integral formation either by initial deposition, deposition followed by removal, or in any other way.

More specifically the embodiment illustrated in FIG. 6 includes a membrane 104 supported by support structures or posts 103. The membrane 104 has a nominal uniform thickness ($d_{nom}$) extending between the posts 103 except for first 171 and second trenches 172 wherein membrane material is absent from or has been removed from the upper surface 177 of the membrane outside of a cavity 110 formed between the membrane and the substrate. The trenches have first ($w_1$) and second ($w_1$) widths and first ($td_1$) and second ($td_1$) trench depths, which in the embodiment are approximately the same, but generally may be either the same or different.

The device also includes a first thickened portion 176 formed on or integral with the rest of the membrane 104 on the inner surface 178 of the membrane within the transducer cavity 110 and having a first lateral dimension ($d_{L1}$) and a first thickness ($d_{T1}$). The device also includes a second thickened portion 175 formed on or integral with the membrane on the outer surface 177 of the membrane outside of the transducer cavity 110 and having a second lateral dimension ($d_{L2}$) and a second thickness ($d_{T2}$). In this embodiment the first lateral dimension is greater than the second lateral dimension and the first thickness; is less than the second thickness ($d_{T2}$). Both, the first and second thickened portions are defined between the two trenches on either side. It will be appreciated in light of the description provided here that the relative lateral and thickness dimensions of the first and second thickened portions in the structure may be modified to provide the desired membrane static and/or dynamic characteristics, and that by way of example but not limitation, the first thickened portion lateral dimension may be any of less-than, greater-than, or equal to the second thickened portion lateral dimension; and, that the first thickened portion thickness dimension may be any of less-than, greater-than, or equal to the second thickened portion thickness dimension.

Figure 7:
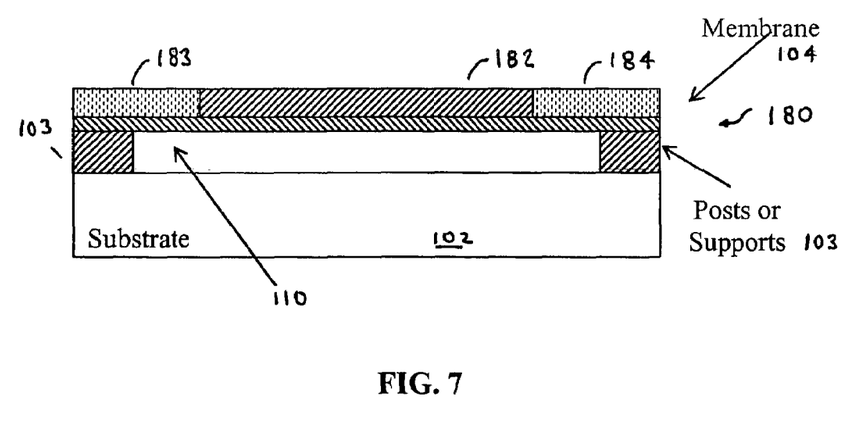
FIG. 7 is an illustration showing an embodiment of a CMUT structure having a plurality of materials to form a membrane having non-uniform properties even when the thickness may be uniform.

Other embodiments of the invention may achieve the desired mass distribution, alteration of membrane thickness or other advantages of the invention by providing a constant thickness membrane having different material properties in different regions of the membrane. An embodiment of such a CMUT structure is illustrated in FIG. 7. In this embodiment 180, a plurality of materials are formed in or on the membrane. For example, different materials may be deposited (and/or deposited and partially removed) that may have either different density, elasticity, stiffness, or other physical and/or electrical properties so that the CMUT may achieved different operational and/or performance. They form a composite membrane that may or may not have a uniform layer spanning between the posts or supports 103. In the illustrated embodiment of a CMUT cell, a first layer 181 spans entirely across the cavity 110 and a second layer includes a second partial layer of material 182 that spans the center portion of the CMUT cell, and a third partial layer 183, 184 spans the outer portion of the CMUT cell. Therefore in this embodiment, the non-uniform membrane may be considered as a non-isotropic membrane and is achieved by different materials resulting in different density profile, different membrane stiffness profile, or other varying membrane property over the membrane, rather then having a different thickness. These structures may be combined with either or both of additional thickened portions above or below the membrane and/or trenches. A capacitive micro-machined ultrasonic transducer may advantageously be designed so that the width of a trench, its location with respect to the edge of the membrane, and its depth are determined by the desired sensitivity and/or resonant frequency of the membrane.

Having now described many structures, it will be appreciated in light of the description provided here that embodiments of the invention also provide a method for designing or specifying a CMUT having particular operation or performance characteristics. This novel method is made possible at least in part by the ability to separately control CMUT membrane properties independently or at least substantially independently of each other. In one embodiment, a method for designing a capacitive micro-machined ultrasonic transducer (CMUT) includes: specifying a CMUT membrane mass characteristic to achieve a first performance metric; specifying a CMUT membrane stiffness characteristic to achieve a second performance metric, the specification of the membrane mass and thickness being independent of each other; and determining a CMUT membrane structure having a non-uniform membrane thickness using the specified membrane mass and membrane stiffness characteristics. When the CMUT may include a trench, the method may further include the trench feature in the design for the structure. In this case, the method may further include the step of including at least one trench in at least one of the steps of specifying the membrane mass characteristic and the membrane stiffness characteristic, and determining the CMUT membrane structure having a non-uniform membrane thickness using the specified membrane mass and membrane stiffness characteristics and a trench. The metric for which the design is directed may be any of the operational or performance characteristics for the CMUT or for an array of CMUTs.

As before, each configuration can be implemented using various fabrication techniques, including MEMS techniques and procedures. By way of example, but not limitation, the membrane where the thick part of the membranes is in the cavity may be built first and then the top or outer portion may be made of metal deposited and patterned over the first part.

Embodiments of the invention having at least one trench have been demonstrated to provide a higher sensitivity relative to non-trenched CMUT cells even for the same membrane thickness in non-trenched regions. The following paragraphs describe some of the advantageous and beneficial effects of trenched membranes and the improved mechanical efficiency and mechanical sensitivity for such trenched CMUT transducers or other vibrating membrane devices.

Embodiments of the invention that include one or more trenches provide a capacitive micromachined ultrasonic transducer (CMUT) or any other vibrating membrane device having higher mechanical sensitivity than similar devices without trenches.

The sensitivity of vibrating membrane devices, such as but not limited to capacitive micromachined ultrasonic transducer (CMUT) devices, may usually be a product of or influenced by two sensitivities: an electrical sensitivity (measured for example in Volt/Angstrom) and a mechanical sensitivity (measured for example in Angstrom/Pascal). The electrical sensitivity relates to converting the movement or displacement of the transducer membrane into an electrical signal. The mechanical sensitivity relates to the conversion of input pressure on the membrane to its displacement:

In a sensing application, such as for a microphone or microphone array, as well as for output signal generation applications, if the membrane is sealed, the membrane may typically have a relatively large spring constant and as a result a relatively lower mechanical sensitivity.

Figure 8:
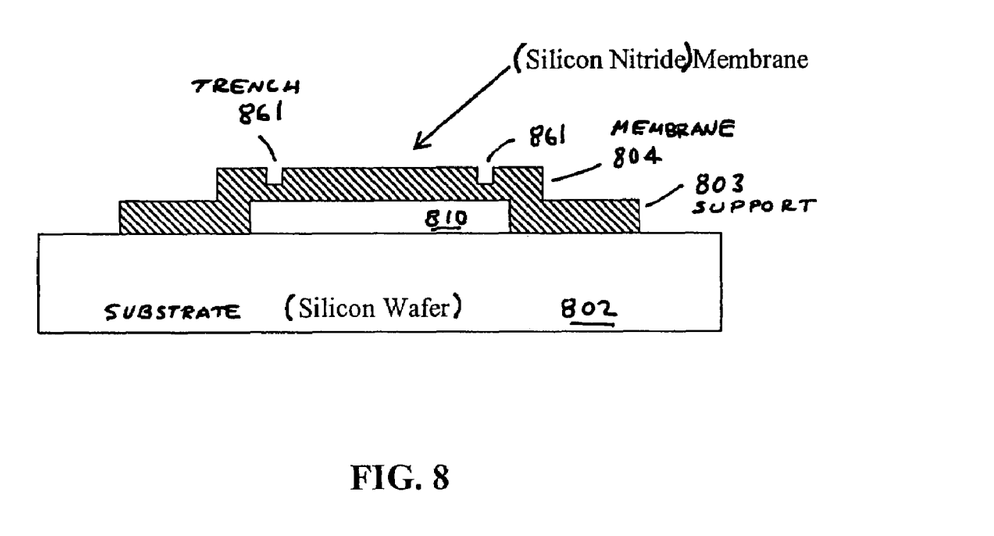
FIG. 8 is an illustration showing an embodiment of a CMUT cell with a trench etched in the membrane to yield a thin membrane through which the large mass of the membrane is attached.

FIG. 8 is an illustration showing an embodiment of a CMUT cell with a trench etched in the membrane to yield a thin membrane through which the large mass of the membrane is attached. The location and dimension of the trench or trenches may be chosen to determine the resonant frequency and mechanical sensitivity of the CMUT cell.

In one aspect, a trench is etched or otherwise formed into the membrane (and/or a thickened portion is added to an existing membrane), such that the attachment of the bulk of the membrane is through a much thinner section which has a lower spring constant. A membrane having this structure will deflect more due to a given input pressure and therefore has a higher mechanical sensitivity. The location and dimensions of the trench (or trenches) may be chosen and made according to design because they influence the frequency of resonance of the membrane and its mechanical sensitivity.

Figure 9:
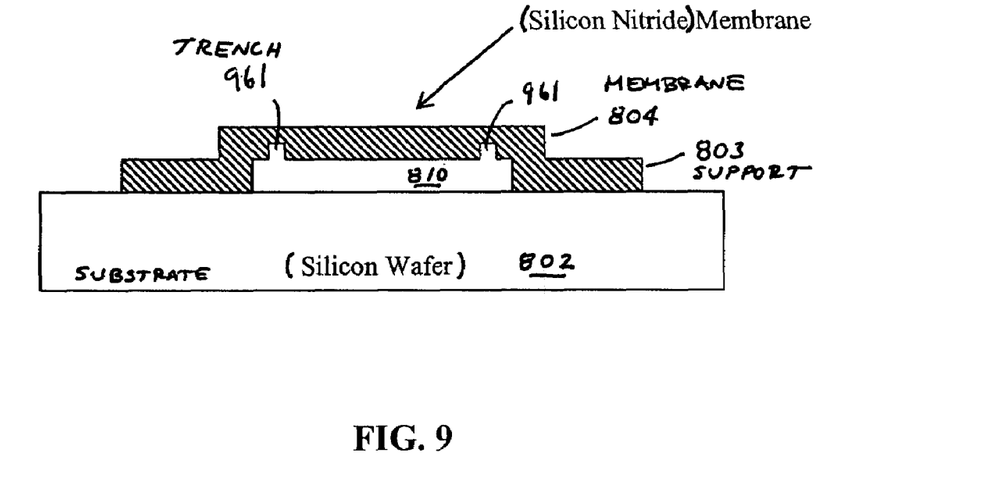
FIG. 9 is an illustration showing an embodiment of an embodiment of a CMUT cell having a single trench on the inner surface of the membrane within the cavity.

A membrane having one or more trenches may also be applied to immersion CMUTs, however, when used in an immersion application (for example under water or in another fluid environment), the one or more trenches are advantageously made or formed inside the sealed transducer cavity rather than outside the cavity in order not to trap water or humidity (or other fluid) which may influence the operation of the membrane. An embodiment of a CMUT cell having a single trench on the inner surface of the membrane within the cavity is illustrated in cross-section view in FIG. 9. In the FIG. 9 embodiment, the trench such as an annular trench in a circular membrane of a CMUT cell is etched or otherwise formed on the inside rather than the outside of the membrane.

It may be appreciated that as with the other embodiments described herein, the cells do not have to be circular or any other particular shape, and by way of example but not limitation, cells may be square, rectangular, pentagonal, hexagonal, or any other polygon, or regular or irregular shape. Consequently the one or more trenches may be any shape, and although in many embodiments, the trenches may follow that shape or not follow the shape and be different from it. When a plurality of trenches are made, formed, or otherwise provided, their shape or path within a cell may be different. For example, if the cell has a hexagonal shape and has three trenches, one trench may follow the hexagonal membrane shape near the peripheral edge of the membrane, a circular or annular trench nearer to the mid-radius region of the cell, and a dodecagonal shaped trench intermediate between the other two trenches. The width and depth of the different trenches may also vary.

Figure 10:
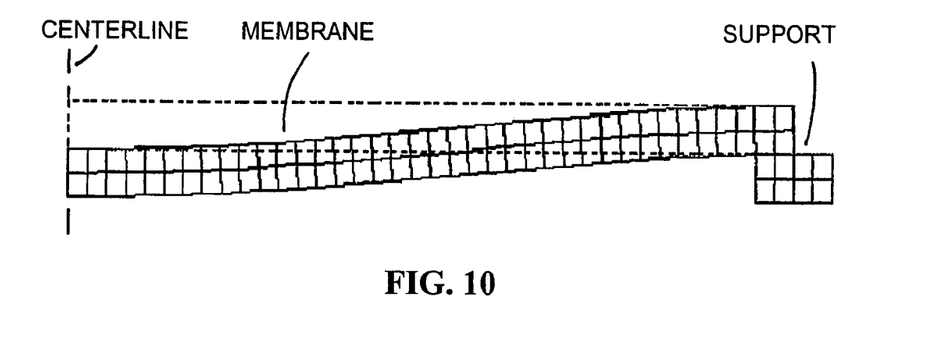
FIG. 10 is an illustration showing the displacement of a non-trenched membrane having a uniform thickness.

The improvement of the mechanical sensitivity for a membrane with and without trenches is illustrated in FIG. 10 through FIG. 14, now described. FIG. 10 illustrates the displacement of a membrane having a uniform thickness and supported by posts or other support structure such as walls of a sealed support around the cell but without a trench. At best, the membrane may have a maximum displacement in the center of the cell, but will have substantially no displacement at its peripheral edge and what may be approximated as a somewhat linearly decreasing displacement from the center toward the peripheral edge.

Figure 11:
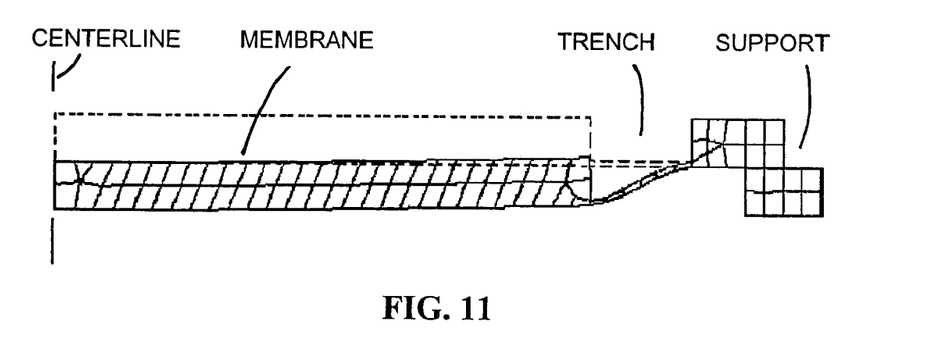
FIG. 11 illustrates an embodiment of a membrane with a trench somewhat near but not at the peripheral edge of the cell and on the outside surface of the membrane.

FIG. 11 illustrates an embodiment of a membrane with a trench somewhat near but not at the peripheral edge of the cell and on the outside surface of the membrane. In this embodiment, substantially the entire membrane between or within the trenched portion of the membrane undergoes nearly the same maximum displacement. The illustration shows that the trenched portion of the membrane permits the membrane to flex over that region because of the decreased stiffness and a lower spring constant. It is apparent that there is some slight bending or bowing of the membrane over at least some of the remainder of the membrane but if this exists it may be controlled to be relatively small if desired. The relative displacement, bending, stiffness, and the like of different portions may be designed and fabricated to achieve desired operation and performance. These same effect may be achieved by making or forming the trench on the inside of the cell and again may be preferred if the cell or cell array is to be used in an immersive environment.

Figure 12:
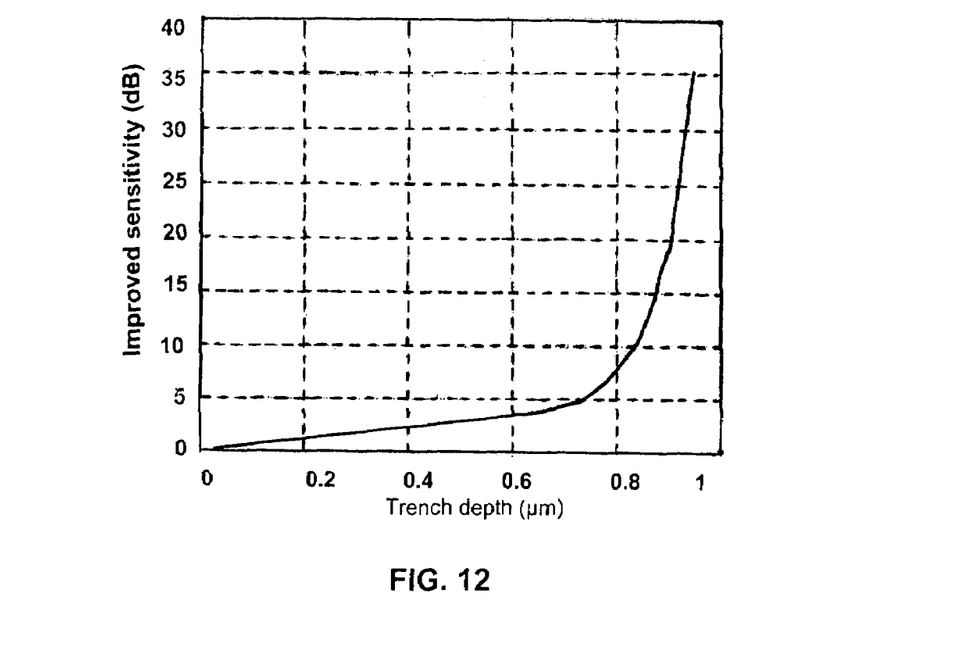
FIG. 12 is an illustration showing a graphical plot of Improved Sensitivity (dB) versus Trench Depth (microns) and the improvement of mechanical sensitivity as a function of trench depth for an exemplary membrane structure.

FIG. 12 is an illustration showing a graphical plot of Improved Sensitivity (dB) versus Trench Depth (microns) and the improvement of mechanical sensitivity as a function of trench depth as it is increased from 0 microns (no trench) to about 0.95 microns for a particular embodiment of the CMUT cell and membrane. This data is exemplary and the numerical range of the trench depth is not intended to represent the range of trench depth over which the invention is limited.

Figure 13:
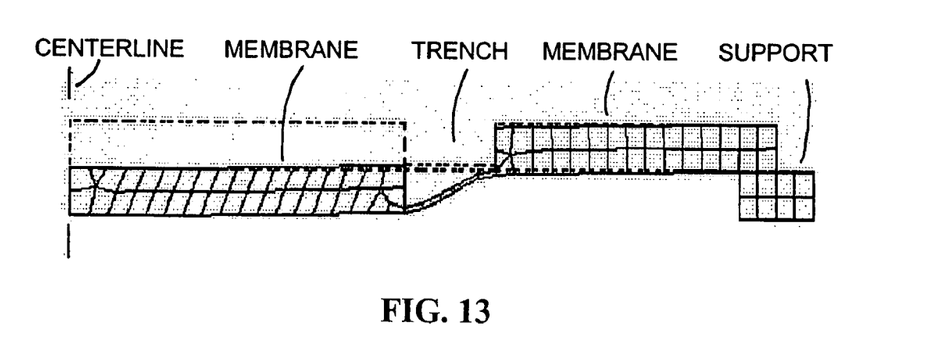
FIG. 13 illustrates another embodiment of a membrane with a trench somewhat further from the peripheral edge of the cell than the embodiment in FIG. 11.
Figure 14:
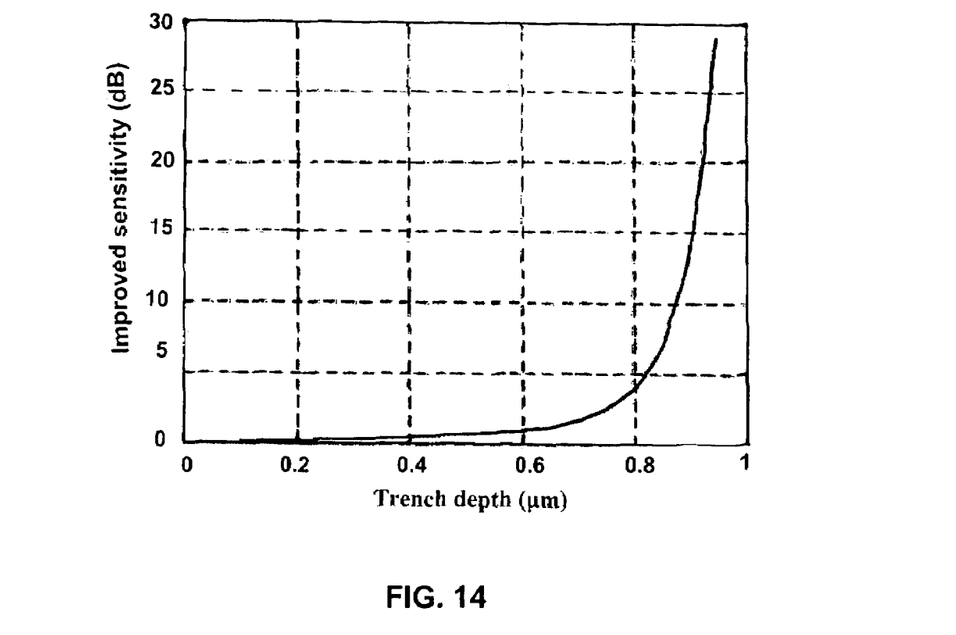
FIG. 14 is an illustration showing a graphical plot of Improved Sensitivity (dB) versus Trench Depth (microns) and the improvement of mechanical sensitivity as a function of trench depth for another exemplary membrane structure.

FIG. 13 illustrates another embodiment of a membrane with a trench somewhat further from the peripheral edge of the cell than the embodiment in FIG. 11 toward the center and near the edge of the metal electrode. It may be observed that as in the FIG. 11 embodiment, the trenched portion of the membrane permits the membrane to flex over that thinned region because of the decreased stiffness and a lower spring constant of the membrane in that region. In this embodiment, for the same membrane displacement one may reasonably expect the sensitivity to be lower than that in the FIG. 11 embodiment because for the same cell dimensions, the total volume displaced by the membrane will be less. This is bourn out by the plot of Improved Sensitivity (dB) versus Trench Depth (microns) of FIG. 14 which has a similar curve shape as in FIG. 12 but at a different vertical or output scale. Both of the trenched embodiment do however have improved sensitivity as compared to the non-trenched embodiment of FIG. 10.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

We claim:

1. A capacitive micro-machined ultrasonic transducer as comprising:
   a substrate;
   a support having a base in contact with the substrate, and a wall extending away from the base to a top; and
   a membrane having an upper surface and a lower surface and extending in a lateral dimension parallel to the support and between the support wall to create a cavity defined by the substrate, the wall, and the membrane lower surface and a defining a gap between the substrate and the membrane;
   the membrane having a non-uniform membrane thickness extending in a direction orthogonal to the membrane surface, the non-uniformity in the membrane thickness resulting from at least one of: (i) a thickening on the upper surface of the membrane outside of the cavity, (ii) a thickening on the lower surface of the membrane inside of the cavity, (iii) a trench on an upper surface of the membrane, (iv) a trench on a lower surface of the membrane, and (v) any combination of two or more of these;
   the device includes at least one trench formed into the membrane and at least one additional thickened membrane portion; and
   wherein at least one of:
   (a) the first thickened portion and the second thickened portion overlie or substantially overlie each other on opposite surfaces of the membrane,
   (b) the first thickened portion and the second thickened portion do not overlie or substantially overlie each other on opposite surfaces of the membrane, and
   (c) the first thickened portion and the second thickened portion partially overlie each other on opposite surfaces of the membrane.

2. A capacitive micro-machined ultrasonic transducer as in claim 1, wherein the substrate is formed of a silicon material; the support is formed of an oxide material; and the membrane is formed of a silicon material.

3. A capacitive micro-machined ultrasonic transducer as in claim 1, wherein the non-uniformity in the membrane thickness resulting from at least one of: (i) a thickening of the membrane on the upper surface of the membrane outside of the cavity, and (ii) a thickening of the membrane on the lower surface of the membrane inside of the cavity.

4. A capacitive micro-machined ultrasonic transducer as in claim 1, wherein the non-uniformity in the membrane thickness resulting from: a thickening of the membrane on at least one of the upper surface and the lower surface of the membrane, and at least one trench formed into the membrane on an upper or lower surface of the membrane.

5. A capacitive micro-machined ultrasonic transducer as in claim 1, wherein the thickness of the membrane is made nonuniform in a region over the gap or cavity formed between the membrane and the substrate.

6. A capacitive micro-machined ultrasonic transducer as in claim 1, wherein the membrane thickness and thickness profile, the lateral membrane dimensions (or diameter or radius), and the membrane material properties determine the membrane stiffness and membrane mass and determine capacitance, collapse voltage, and operating frequency.

7. A capacitive micro-machined ultrasonic transducer as in claim 6, wherein both the membrane stiffness and the membrane mass increase as the lateral dimensions and thickness increase and the membrane stiffness and the membrane mass are modified to some extent independently of each other by providing the non-uniform membrane thickness to achieve an optimum transducer performance.

8. A capacitive micro-machined ultrasonic transducer as in claim 1, wherein the membrane has a central portion and the central portion of the membrane is made thicker than portions outside the central portion so that the transducer generates more transducer output pressure in operation than a transducer of the same membrane lateral dimension not having a thickened central portion.

9. A capacitive micro-machined ultrasonic transducer as in claim 1, wherein the membrane thickness, the membrane lateral dimensions (or diameter or radius), and the membrane material properties determine the stiffness and the mass of the membrane and therefore determine transducer device parameters.

10. A capacitive micro-machined ultrasonic transducer as in claim 9, wherein the device parameters include at least one of capacitance, collapse voltage, and operation frequency.

11. A capacitive micro-machined ultrasonic transducer as in claim 1, wherein the thickened membrane portion is characterized by one of (i) the membrane being thicker or having added membrane mass above a nominal lateral plane of the membrane, (ii) the membrane being thicker or having added membrane mass below a nominal lateral plane of the membrane, and (iii) the membrane being thicker or having added membrane mass above and below a nominal lateral plane of the membrane.

12. A capacitive micro-machined ultrasonic transducer as in claim 1, wherein the non-uniform membrane thickness is structured to achieve at least one of: (i) control the average membrane displacement, (ii) maximize the average membrane displacement, and (iii) maximize the membrane displacement.

13. A capacitive micro-machined ultrasonic transducer as in claim 1, wherein the membrane has a non-uniform thickness profile that is structured to provide a more uniform harmonic vibration amplitude at the central portion of the membrane and at the membrane peripheral portion close to the edge of the membrane adjacent the support wall.

14. A capacitive micro-machined ultrasonic transducer as in claim 1, the non-uniformity in the membrane thickness resulting from at least one of: (i) a thickening of the membrane on the upper surface of the membrane outside of the cavity, and (ii) a thickening of the membrane on the lower surface of the membrane inside of the cavity; the thickening resulting in an increased mass toward the center of the membrane and the increased mass resulting in an increased capacitance of the CMUT device.

15. A capacitive micro-machined ultrasonic transducer as in claim 1, wherein the membrane has a membrane thickness profile or membrane shape that is modified from uniform thickness or shape to modify membrane displacement characteristics to more nearly equalize the membrane displacement proximate the center of the membrane and near the peripheral edge of the membrane.

16. A capacitive micro-machined ultrasonic transducer as in claim 1, wherein the membrane includes at least one of a trench formed into the membrane on an upper surface of the membrane, and a trench formed into the membrane on a lower surface of the membrane, and operates as a sensing microphone device having increased mechanical sensitivity.

17. A capacitive micro-machined ultrasonic transducer as in claim 16, wherein the at least one of a trench is a trench formed into the membrane on a lower surface of the membrane within a sealed cavity, and the transducer is adapted for use in liquid immersion environment as either a sensing microphone input device having increased mechanical sensitivity or as an output device.

18. A capacitive micro-machined ultrasonic transducer as in claim 1, wherein the membrane includes at least one trenched portion that has a membrane thickness that is thinner than the membrane thickness in untrenched portions of the membrane.

19. A capacitive micro-machined ultrasonic transducer as in claim 18, wherein the membrane thickness in untrenched portions of the membrane is substantially constant.

20. A capacitive micro-machined ultrasonic transducer as in claim 18, wherein the membrane thickness in untrenched portions of the membrane is non-uniform and includes thickened portions.

21. A capacitive micro-machined ultrasonic transducer as in claim 18, wherein at least one trench comprises a plurality of trenches formed into the membrane.

22. A capacitive micro-machined ultrasonic transducer as in claim 18, wherein the trenches are formed into the membrane on at least one of: (i) the upper surfaces of the membrane outside of the cavity, (ii) the lower surfaces of the membrane within the cavity, and (iii) both the upper surfaces of the membrane and on the lower surfaces of the membrane within a cavity in the transducer device.

23. A capacitive micro-machined ultrasonic transducer as in claim 18, wherein a plurality of trenches are formed in the membrane and each of the plurality of trenches are formed having a trench width and a trench depth, and the trench width and trench depth for any one particular trench may be varied independently of the trench width and trench depth for any other particular trench.

24. A capacitive micro-machined ultrasonic transducer as in claim 18, wherein the membrane is substantially circular, and the first and second thickened portions are substantially circular, and the first thickened portion has a first radius measured from the center of the membrane, the second thickened portion has a second radius measured from the center of the membrane, and the circular membrane has a third radius measured from the center of the membrane.

25. A capacitive micro-machined ultrasonic transducer as in claim 24, wherein the first radius is equal to the second radius, and the first and second radius are less than the third radius.

26. A capacitive micro-machined ultrasonic transducer as in claim 24, wherein the first radius is greater than the second radius, and the first and second radius are less than the third radius.

27. A capacitive micro-machined ultrasonic transducer as in claim 24, wherein the first radius is less than the second radius, and the first and second radius are less than the third radius.

28. A capacitive micro-machined ultrasonic transducer as in claim 1, wherein there are a plurality of supports and membranes formed on the substrate.

29. A capacitive micro-machined ultrasonic transducer as in claim 1, wherein the at least one trench is formed having a trench width and a trench depth, and the trench width and trench depth for any trench may be independently varied.

30. A capacitive micro-machined ultrasonic transducer as in claim 1, wherein the membrane thickness profile is adapted so that the membrane spring constant or membrane stiffness is defined substantially independently of the membrane mass.

31. A capacitive micro-machined ultrasonic transducer as in claim 30, wherein the independent specification of membrane stiffness and membrane mass provides a transducer device having an average membrane displacement and corresponding output pressure and a greater transducer device sensitivity as compared to conventional transducer devices.

32. A capacitive micro-machined ultrasonic transducer as in claim 1, wherein the provision at least one trench reduces the stiffness of the membrane while keeping the total membrane mass substantially the same as a membrane without a trench; and the total mass of the trenched membrane is within substantially 10% of the mass of the untrenched membrane.

33. A capacitive micro-machined ultrasonic transducer as comprising:
  a substrate;
  a support having a base in contact with the substrate, and a wall extending away from the base to a top; and
  a membrane having an upper surface and a lower surface and extending in a lateral dimension parallel to the support and between the support wall to create a cavity defined by the substrate, the wall, and the membrane lower surface and a defining a gap between the substrate and the membrane;
  the membrane having a non-uniform membrane thickness extending in a direction orthogonal to the membrane surface, the non-uniformity in the membrane thickness resulting from at least one of: (i) a thickening on the upper surface of the membrane outside of the cavity, (ii) a thickening on the lower surface of the membrane inside of the cavity, (iii) a trench on an upper surface of the membrane, (iv) a trench on a lower surface of the membrane, and (v) any combination of two or more of these;
  the membrane thickness, the membrane lateral dimensions (or diameter or radius), and the membrane material properties determine the stiffness and the mass of the membrane and therefore determine transducer device parameters;
  the device parameters include at least one of capacitance, collapse voltage, and operation frequency; and
  membrane stiffness and the membrane mass increase as the lateral dimensions and thickness increase, and a non-uniform membrane thickness is used so that the capacitance, collapse voltage, and operation frequency parameters can be adjusted substantially individually, separately, and independently.

34. A capacitive micro-machined ultrasonic transducer as in claim 33, wherein this separate, individually, and independent adjustability enables setting at least two transducer parameters to be adjusted substantially independent of each other.

35. A capacitive micro-machined ultrasonic transducer as in claim 34, wherein the at least two transducer parameters that may be adjusted substantially independently of each other are the collapse voltage and the operation frequency.

36. A capacitive micro-machined ultrasonic transducer (CMUT) comprising:
  a substrate;
  a support having a base in contact with the substrate, and a wall extending away from the base to a top; and
  a membrane having a membrane thickness and including an upper surface and a lower surface and extending in a lateral dimension parallel to the support and between the support wall to create a cavity defined by the substrate, the wall, and the membrane lower surface and a defining a gap between the substrate and the membrane;
  an electrode different from the membrane disposed on the upper surface of the membrane and having a separate electrode thickness;
  the membrane having a non-uniform membrane thickness extending in a direction orthogonal to the membrane surface, the non-uniformity in the membrane thickness resulting from at least one of: (i) a thickening of the membrane on the upper surface of the membrane outside of the cavity, (ii) a thickening of the membrane on the lower surface of the membrane inside of the cavity, (iii) a trench formed into the membrane on an upper surface of the membrane, (iv) a trench formed into the membrane on a lower surface of the membrane, and (v) any combination of two or more of these; and the membrane includes at least one trenched portion that has a membrane thickness that is thinner than the membrane thickness in untrenched portions of the membrane, and at least one trenched portion comprises an annular trench having an inner annular radius and an outer annular radius.

37. A capacitive micro-machined ultrasonic transducer as in claim 36, wherein the width of the trench, its location with respect to the edge of the membrane, and its depth are determined by the desired sensitivity and resonant frequency of the membrane.

38. A capacitive micro-machined ultrasonic transducer as in claim 36, wherein at least one trench comprises a trench formed into the membrane having a U-shaped cross-section, a rectangular-shaped cross-section, or a circular-shaped cross-section, or a v-shaped cross-section.

39. A capacitive micro-machined ultrasonic transducer as in claim 36, wherein the non-uniformity in the membrane thickness results from at least one of: (ii) a thickening of the membrane on the lower surface of the membrane inside of the cavity, and (iv) a trench into the membrane on a lower surface of the membrane.

40. A capacitive micro-machined ultrasonic transducer as in claim 36, wherein the trench is formed at a location in the membrane inside the walls forming the CMUT cells that is not coincident with the walls forming the of the CMUT cell so as to separate the mass and spring constant of the membrane.

41. A capacitive micro-machined ultrasonic transducer (CMUT) comprising:
  a substrate;
  a support having a base in contact with the substrate, and a wall extending away from the base to a top;
  a membrane having a membrane thickness and including an upper surface and a lower surface and extending in a lateral dimension parallel to the support and between the support wall to create a cavity defined by the substrate, the wall, and the membrane lower surface and a defining a gap between the substrate and the membrane; and
  an electrode different from the membrane disposed on the upper surface of the membrane and having a separate electrode thickness;
  the membrane having a non-uniform membrane thickness extending in a direction orthogonal to the membrane surface, the non-uniformity in the membrane thickness resulting from at least one of: (i) a thickening of the membrane on the upper surface of the membrane outside of the cavity, (ii) a thickening of the membrane on the lower surface of the membrane inside of the cavity, (iii) a trench formed into the membrane on an upper surface of the membrane, (iv) a trench formed into the membrane on a lower surface of the membrane, and (v) any combination of two or more of these; and
  the membrane includes at least one trenched portion that has a membrane thickness that is thinner than the membrane thickness in untrenched portions of the membrane;
  the trenches are formed into the membrane on at least one of: (i) the upper surfaces of the membrane outside of the cavity, (ii) the lower surfaces of the membrane within the cavity, and (iii) both the upper surfaces of the membrane and on the lower surfaces of the membrane within a cavity in the transducer device; and for transducers having trenches on both upper and lower portions of the membrane, (i) the trenches are formed into the membrane at the same or substantially the same locations on the upper and lower portions of the membrane so that they overlie or underlie each other, and/or (ii) the trenches are formed into the membrane at different locations on the upper and lower portions of the membrane so that they do not overlie or underlie each other.

42. A capacitive micro-machined ultrasonic transducer (CMUT) comprising:

a substrate;

a support having a base in contact with the substrate, and a wall extending away from the base to a top;

a membrane having a membrane thickness and including an upper surface and a lower surface and extending in a lateral dimension parallel to the support and between the support wall to create a cavity defined by the substrate, the wall, and the membrane lower surface and a defining a gap between the substrate and the membrane; and an electrode different from the membrane disposed on the upper surface of the membrane and having a separate electrode thickness;

the membrane having a non-uniform membrane thickness extending in a direction orthogonal to the membrane surface, the non-uniformity in the membrane thickness resulting from at least one of: (i) a thickening of the membrane on the upper surface of the membrane outside of the cavity, (ii) a thickening of the membrane on the lower surface of the membrane inside of the cavity, (iii) a trench formed into the membrane on an upper surface of the membrane, (iv) a trench formed into the membrane on a lower surface of the membrane, and (v) any combination of two or more of these; and the membrane includes at least one trenched portion that has a membrane thickness that is thinner than the membrane thickness in untrenched portions of the membrane;

the trenches are formed into the membrane on at least one of: (i) the upper surfaces of the membrane outside of the cavity, (ii) the lower surfaces of the membrane within the cavity, and (iii) both the upper surfaces of the membrane and on the lower surfaces of the membrane within a cavity in the transducer device; and the trenches comprises annular trenches formed in a circular membrane, and the different locations include locations at different radii from the center of a circular membrane.

43. A capacitive micro-35-machined ultrasonic transducer as in claim 42, wherein the device includes at least one trench formed into the membrane and at least one additional thickened membrane portion.

44. A capacitive micro-machined ultrasonic transducer as in claim 43, wherein the at least one additional thickened portion includes a first thickened portion on or adjacent to an upper surface of the membrane.

45. A capacitive micro-machined ultrasonic transducer as in claim 43, wherein the at least one additional thickened portion includes a second thickened portion on or adjacent to a lower surface of the membrane and disposed within the cavity.

46. A capacitive micro-machined ultrasonic transducer as in claim 43, wherein the at least one additional thickened portion includes a first thickened portion on or adjacent to an upper surface of the membrane, and a second thickened portion on or adjacent to a lower surface of the membrane and disposed within the cavity.

47. A capacitive micro-machined ultrasonic transducer as in claim 43, wherein the first thickened portion and the second thickened portion do not overlie or substantially overlie each other on opposite surfaces of the membrane.

48. A capacitive micro-machined ultrasonic transducer as in claim 43, wherein the first thickened portion and the second thickened portion partially overlie each other on opposite surfaces of the membrane.

49. A capacitive micro-machined ultrasonic transducer as in claim 48, wherein the overlying portions comprise a circular or annular overlying.

50. A capacitive micro-machined ultrasonic transducer (CMUT) comprising:

a substrate;

a support having a base in contact with the substrate, and a wall extending away from the base to a top;

a membrane having a membrane thickness and including an upper surface and a lower surface and extending in a lateral dimension parallel to the support and between the support wall to create a cavity defined by the substrate, the wall, and the membrane lower surface and a defining a gap between the substrate and the membrane; and an electrode different from the membrane disposed on the upper surface of the membrane and having a separate electrode thickness;

the membrane having a non-uniform membrane thickness extending in a direction orthogonal to the membrane surface, the non-uniformity in the membrane thickness resulting from at least one of: (i) a thickening of the membrane on the upper surface of the membrane outside of the cavity, (ii) a thickening of the membrane on the lower surface of the membrane inside of the cavity, (iii) a trench formed into the membrane on an upper surface of the membrane, (iv) a trench formed into the membrane on a lower surface of the membrane, and (v) any combination of two or more of these; and the membrane is a substantially circular membrane, and comprises a plurality of substantially concentric annular or circular trenches disposed near the outer circular edge of the membrane; and the substantially concentric annular or circular trenches disposed near the outer edge of the membrane are disposed within an annular region that has a radius of between about 50% and 100% of the radius of the membrane.

51. A capacitive micro-machined ultrasonic transducer device comprising:

a membrane supported by support structures or posts, the membrane having a nominal uniform thickness extending between the support structures or posts except for first and second trenches wherein some membrane material is absent from or has been removed from the upper surface of the membrane outside of a cavity formed between the membrane and the substrate; and at least one of: (i) a first thickened portion formed on or integral with the membrane on the inner surface of the membrane within the transducer cavity and having a first lateral dimension and a first thickness, and (ii) a second thickened portion formed on or integral with the membrane on the outer surface of the membrane outside of the transducer cavity and having a second lateral dimension and a second thickness.

52. A capacitive micro-machined ultrasonic transducer device as in claim 51, wherein the first lateral dimension is greater than the second lateral dimension and the first thickness is less than the second thickness.

53. A capacitive micro-machined ultrasonic transducer device as in claim 51, wherein both the first and second thickened portions are defined between the two trenches on either side.

54. A capacitive micro-machined ultrasonic transducer device as in claim 51, wherein the relative lateral and thickness dimensions of the first and second thickened portions in the structure may be modified to provide the desired membrane static and/or dynamic transducer characteristics.

55. A capacitive micro-machined ultrasonic transducer device as in claim 51, wherein the first thickened portion lateral dimension may be any of less-than, greater-than, or equal to the second thickened portion lateral dimension; and, that the first thickened portion thickness dimension may be any of less-than, greater-than, or equal to the second thickened portion thickness dimension.

56. A capacitive micro-machined ultrasonic transducer device as in claim 51, wherein the at least one of the first and second thickened portions comprise a metal layer deposited by an electro-deposition process.

57. A capacitive micro-machined ultrasonic transducer device as in claim 51, wherein:
　said membrane supported by support structures or posts includes a plurality of membranes supported by a plurality of support structures or posts and a forming a plurality of cavities disposed as a capacitive micro-machined ultrasonic transducer array.

58. A method for designing a capacitive micro-machined ultrasonic transducer (CMUT) comprising:
　specifying a CMUT membrane mass characteristic to achieve a first performance metric;
　specifying a CMUT membrane stiffness characteristic to achieve a second performance metric, the specification of the membrane mass and thickness being independent of each other;
　the specifying of the mass characteristic and the stiffness characteristic including specifying that the membrane exclusive of any electrode thickness has a non-uniform membrane thickness resulting from at least one of: (i) a thickening of the membrane on the upper surface of the membrane outside of a CMUT cavity, (ii) a thickening of the membrane on the lower surface of the membrane inside of the CMUT cavity, (iii) a trench formed into the membrane on an upper surface of the membrane, and (iv) a trench formed into the membrane on a lower surface of the membrane; and
　determining a CMUT membrane structure having the non-uniform membrane thickness using the specified membrane mass and membrane stiffness characteristics.

59. A method as in claim 58, further comprising including at least one trench in at least one of the steps of specifying the membrane mass characteristic and the membrane stiffness characteristic, and determining the CMUT membrane structure having the non-uniform membrane thickness using the specified membrane mass and membrane stiffness characteristics and a trench.

60. A method for designing a capacitive micro-machined ultrasonic transducer (CMUT) as in claim 58, wherein the specifying of the mass characteristic and the stiffness characteristic including specifying that the membrane exclusive of any electrode thickness has a non-uniform membrane thickness resulting from at least one of: (ii) a thickening of the membrane on the lower surface of the membrane inside of the CMUT cavity, and (iv) a trench formed into the membrane on a lower surface of the membrane.

* * * * *

UNITED STATES PATENT AND TRADEMARK OFFICE
CERTIFICATE OF CORRECTION

| | | |
|---|---|---|
| PATENT NO. | : 7,615,834 B2 | Page 1 of 1 |
| APPLICATION NO. | : 11/707623 | |
| DATED | : November 10, 2009 | |
| INVENTOR(S) | : Khuri-Yakub et al. | |

It is certified that error appears in the above-identified patent and that said Letters Patent is hereby corrected as shown below:

In The Specification Under Column 1:

• Please replace lines 15-17 with:

-- This invention was made with Government support under contract DAAD19-00-1-0190 awarded by the Department of the Army. The Government has certain rights in this invention. --

Signed and Sealed this
Twelfth Day of June, 2012

David J. Kappos
*Director of the United States Patent and Trademark Office*